United States Patent
Cheng et al.

(10) Patent No.: US 12,211,890 B2
(45) Date of Patent: Jan. 28, 2025

(54) BARRIER LAYER FOR METAL INSULATOR METAL CAPACITORS

(71) Applicant: TAIWAN SEMICONDUCTOR MANUFACTURING CO., LTD., Hsinchu (TW)

(72) Inventors: Anhao Cheng, Taichung (TW); Fang-Ting Kuo, Zhubei (TW); Yen-Yu Chen, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/815,524

(22) Filed: Jul. 27, 2022

(65) Prior Publication Data

US 2022/0367606 A1    Nov. 17, 2022

Related U.S. Application Data

(62) Division of application No. 16/830,981, filed on Mar. 26, 2020.

(51) Int. Cl.
*H01L 23/522* (2006.01)
*H01L 23/528* (2006.01)
*H01L 49/02* (2006.01)

(52) U.S. Cl.
CPC .......... *H01L 28/75* (2013.01); *H01L 23/5223* (2013.01); *H01L 23/5283* (2013.01); *H01L 28/65* (2013.01)

(58) Field of Classification Search
CPC ............. H01L 23/5223; H01L 23/5283; H01L 23/642; H01L 28/40; H01L 28/88;
(Continued)

(56) References Cited

U.S. PATENT DOCUMENTS

| 5,985,731 A | 11/1999 | Weng et al. |
| 6,750,500 B1 * | 6/2004 | Agarwal ................. H01L 28/75 |
| | | 257/532 |
| 8,003,462 B2 | 8/2011 | Nakabayashi |
| 8,008,161 B2 | 8/2011 | Bachmann et al. |

(Continued)

FOREIGN PATENT DOCUMENTS

| CN | 103456601 A | 12/2013 |
| CN | 105659360 A | 6/2016 |

(Continued)

OTHER PUBLICATIONS

Taiwan (TIPO) Examination Report with attached Search Report directed to related Taiwanese Application No. 11020807330, dated Aug. 23, 2021; 10 pages.

(Continued)

*Primary Examiner* — Thanhha S Pham
(74) *Attorney, Agent, or Firm* — Sterne, Kessler, Goldstein & Fox P.L.L.C.

(57) ABSTRACT

The present disclosure is directed to a method for the fabrication of MiM capacitor structures with metallic electrodes having nitrogen-rich metal nitride layers. The method includes depositing a first electrode bilayer on a first interconnect disposed on a substrate, where the first electrode includes a first layer and a second layer with a different nitrogen concentration. The method also includes depositing a dielectric layer on the first electrode bilayer and depositing a second electrode bilayer on the first interconnect where the second electrode includes a third layer and a fourth layer with a different nitrogen concentration. The method further includes patterning the first electrode bilayer, the dielectric layer, and the second electrode bilayer to form a capacitor structure on the first interconnect layer.

20 Claims, 12 Drawing Sheets

(58) Field of Classification Search
CPC ......... H01L 28/92; H01L 28/57; H01L 28/75; H01L 21/76834
See application file for complete search history.

(56) References Cited

U.S. PATENT DOCUMENTS

| | | | |
|---|---|---|---|
| 9,466,660 | B2 | 10/2016 | Rocklein et al. |
| 9,530,833 | B2 | 12/2016 | Triyoso et al. |
| 9,660,016 | B2 | 5/2017 | Chang et al. |
| 9,812,522 | B2 | 11/2017 | Adusumilli et al. |
| 10,658,455 | B2 | 5/2020 | Hsu et al. |
| 11,088,084 | B2 | 8/2021 | Lee et al. |
| 2006/0121685 | A1 | 6/2006 | Izumi |
| 2006/0160301 | A1 | 7/2006 | Shim |
| 2009/0316331 | A1 | 12/2009 | Nakabayashi |
| 2013/0140553 | A1 | 6/2013 | Yamazaki et al. |
| 2013/0149794 | A1 | 6/2013 | Wang |
| 2013/0320493 | A1 | 12/2013 | Chang et al. |
| 2015/0004718 | A1 | 1/2015 | Sun et al. |
| 2015/0102460 | A1 | 4/2015 | Rocklein et al. |
| 2016/0204190 | A1 | 7/2016 | Chu et al. |
| 2017/0141300 | A1 | 5/2017 | Trinh et al. |
| 2020/0006639 | A1 | 1/2020 | Wu et al. |
| 2020/0020644 | A1 | 1/2020 | Lee et al. |
| 2021/0143248 | A1* | 5/2021 | Allman .................. H10B 53/30 |
| 2022/0367610 | A1 | 11/2022 | Hsu et al. |

FOREIGN PATENT DOCUMENTS

| | | |
|---|---|---|
| CN | 107403731 A | 11/2017 |
| CN | 109585425 A | 4/2019 |
| CN | 110649155 A | 1/2020 |
| CN | 110729275 A | 1/2020 |
| CN | 112445433 A | 3/2021 |
| CN | 112764696 A | 5/2021 |
| DE | 102 60 352 A1 | 7/2004 |
| DE | 10 2015 208 657 A1 | 12/2015 |
| JP | 2016526798 A | 9/2016 |
| KR | 20060067395 A | 6/2006 |
| KR | 20070023148 A | 2/2007 |
| KR | 101397977 B1 | 5/2014 |
| TW | 201349514 A | 12/2013 |
| TW | 201526206 A | 7/2015 |
| TW | 201916424 A | 4/2019 |
| TW | 202006957 A | 2/2020 |

OTHER PUBLICATIONS

Korean Office Action, dated Sep. 17, 2021, for Korean Intellectual Property Office Appl. No. 10-2020-0088936, 7 pages.
Chinese Office Action, directed to Chinese Patent Application No. 202110035145.5, mailed Oct. 23, 2024; 27 pages.

* cited by examiner

BARRIER LAYER FOR METAL INSULATOR METAL CAPACITORS

CROSS-REFERENCE TO RELATED APPLICATION

This patent application is a divisional of U.S. patent application Ser. No. 16/830,981, filed on Mar. 26, 2020 and titled "Barrier Layer for Metal Insulator Metal Capacitors," which is incorporated by reference herein in its entirety.

BACKGROUND

Decoupling capacitors can be built into a chip to prevent voltage spikes in a power supply, such as when the chip is initially powered or when various components of the chip are activated. In the chip fabrication process, decoupling capacitors can be integrated in the back-end of the line after transistor formation.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

DETAILED DESCRIPTION

Figure 1:
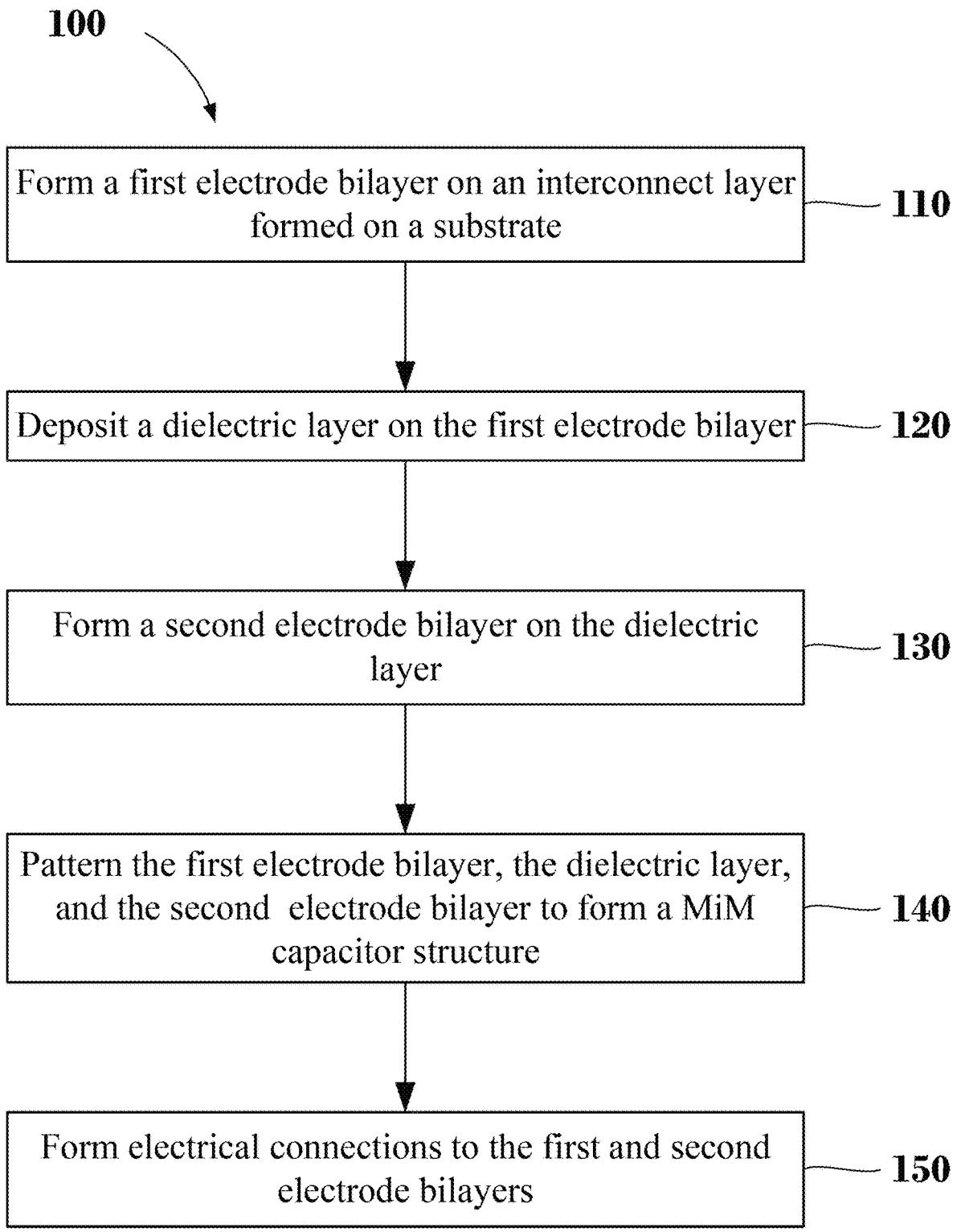
FIG. 1 illustrates a method for forming for forming a metal-insulator-metal stack with nitrogen-rich electrode layers, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. It is to be understood that the terms "about" and "substantially" can refer to a percentage of the values as interpreted by those skilled in relevant art(s) in light of the teachings herein.

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes or tolerances. Unless defined otherwise, technical and scientific terms used herein have the same meanings as commonly understood by one of ordinary skill in the art to which this disclosure belongs.

Decoupling capacitors (DeCAP) can be built into a chip to prevent voltage spikes in a power supply, such as when the chip is initially powered or when various components of the chip are activated. Since the power supply cannot instantaneously respond to such power demand changes, the chip's power voltage can change for a brief period until the power supply can respond and stabilize the voltage. Voltage spikes may occur during this transient time. Decoupling capacitors can suppress these voltage spikes. Decoupling capacitors with higher capacitance can further suppress the voltage spikes.

Decoupling capacitors integrated in the back-end-of-line (BEOL) offer several advantages including, but not limited to, reduced time delay due to a short interconnect length, reduced power consumption, compact size, and a wide capacitance range due to their flexible design. Since integrated decoupling capacitors are formed alongside semiconductor devices and interconnect layers, they can benefit from the materials and methods used in semiconductor fabrication such as various metals, dielectrics, photolithography and etching operations, metal and dielectric deposition methods, etc.

By way of example and not limitation, decoupling capacitors integrated in BEOL can have the form of parallel plate capacitor structures—e.g., metal-insulator-metal (MiM) stacks—where a dielectric layer is disposed between a pair of metal or metallic layers (also referred to herein as "electrodes"). Interconnect structures, such as metal vias, can be formed on each electrode of the MiM stack to electrically couple the capacitor structure to other elements in an integrated circuit.

The dielectric layers used in the MiM stacks can include a single dielectric material or a stack of dielectric materials with a thickness between about 1 nm and about 20 nm. Due to their finite thicknesses, these dielectric layers can be sensitive to charges generated by semiconductor fabrication methods that use plasma. Such semiconductor fabrication methods include processes used during or after the formation of the MiM stack. By way of example and not limitation, processes that can generate charges include etching processes (e.g., dielectric etching, metal etching, etc.) and "plasma-assisted" deposition processes (e.g., physical vapor deposition (PVD), plasma-enhanced chemical vapor deposition (PECVD), plasma-enhanced deposition (PEALD), etc.). The presence of charges in the dielectric layer of the MiM capacitor can impact the capacitor's operation. For example, charges present in the dielectric can form a conductive path for current to flow between the electrodes of the MiM capacitor, thus preventing the MiM capacitor from operating as intended. Since "charge-generating" processes are essential in semiconductor fabrication, MiM capacitors need to be immune or more tolerant to charges generated by the semiconductor fabrication process.

To address the above challenges, the embodiments described herein are directed to a method for forming MiM capacitor structures with metallic electrodes that feature nitrogen-rich layers. These nitrogen-rich layers are formed in contact with the dielectric layer to prevent charges (e.g., generated by plasma-based processes) from reaching and damaging the dielectric layer of the MiM stack. In some embodiments, the metallic electrodes include a metal nitride bilayer with different metal-to-nitrogen ratios ("M/N ratios"). In some embodiments, the nitrogen concentration of the metal nitride layers formed in contact with the dielectric layer is higher than the nitrogen concentration of the metal nitride layers formed not in contact with the dielectric layer. In some embodiments, metals used to form the metal nitride layers of the electrode bilayers described herein include titanium (Ti), tantalum (Ta), tungsten (W), cobalt (Co), nickel (Ni), ruthenium (Ru), molybdenum (Mo), gold (Au), silver (Ag), and aluminum (Al). In some embodiments, the electrodes can be deposited with a CVD process, a PVD process, an atomic layer deposition (ALD) process, or any other suitable deposition method capable of depositing metal nitride layers with a nitrogen concentration that ranges from 0 (e.g., a pure metal) to about 40%.

FIG. 1 is a flowchart diagram of a fabrication method 100 for forming a MiM capacitor with electrodes featuring nitrogen-rich layers, according to some embodiments. This disclosure is not limited to this operational description. For example, other fabrication operations may be performed between the various operations of method 100 and may be omitted merely for clarity and ease of description. These various operations are within the spirit and the scope of this disclosure. Additionally, not all operations may be required to perform the disclosure provided herein. Some of the operations may be performed simultaneously, or in a different order than the ones shown in FIG. 1. In some embodiments, one or more other operations may be performed in addition to or in place of the presently described operations. Method 100 will be described in reference to FIGS. 2 through 12, which are for illustrative purposes and may not be to scale.

Figure 2:
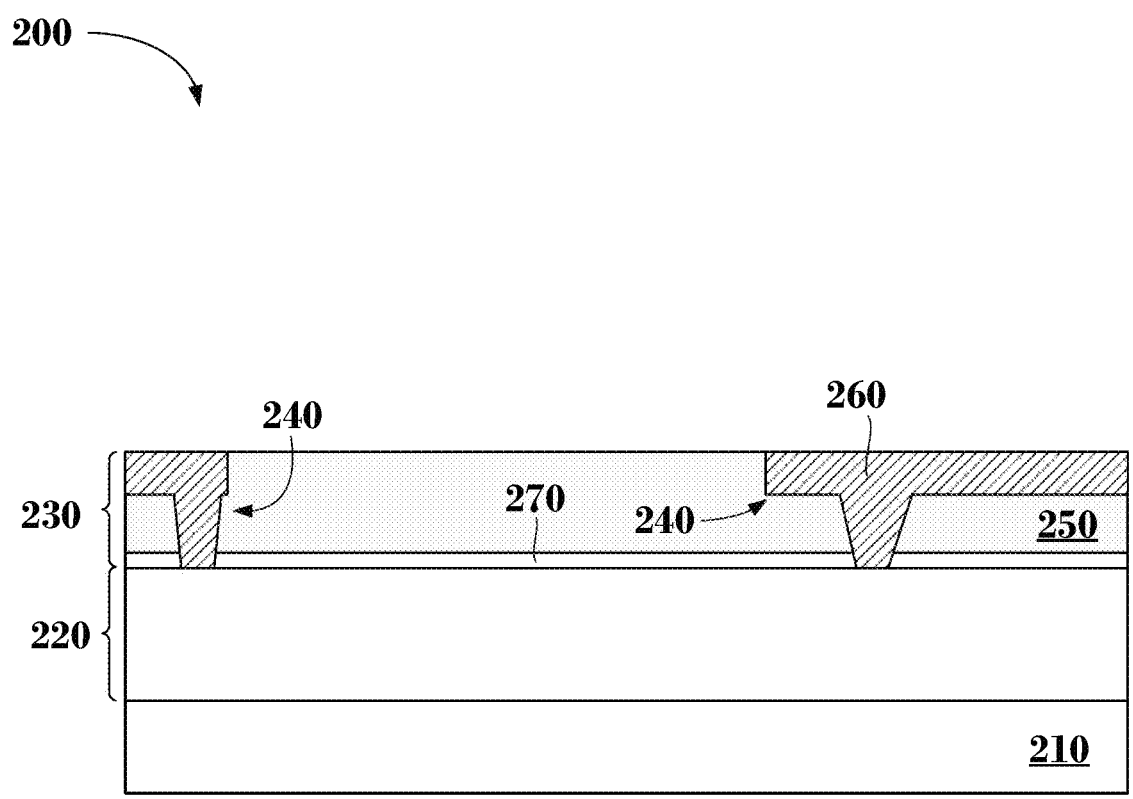
FIGS. 2-12 are cross-sectional views of intermediate structures during the fabrication of a metal-insulator-metal stack with nitrogen-rich electrode layers, according to some embodiments.

In some embodiments, FIG. 2 is a cross-sectional view of a partially-fabricated stack 200 used as a "starting point" structure for method 100 shown in FIG. 1. Partially-fabricated structure 200 ("structure 200") can be, for example, a partial cross-sectional view of a partially-fabricated integrated circuit (IC). By way of example and not limitation, structure 200 can include a substrate 210 with a front-end-of-line (FEOL)/middle-of-line (MOL) layer 220 formed thereon and an interconnect layer 230 formed on FEOL/MOL layer 220. For ease of description, select portions and features of structure 200 are shown in FIG. 2. For example, isolation regions, doped regions, source/drain regions and other features, structures, or elements formed within or on substrate 210 are not shown in FIG. 2 for simplicity. Further, active devices, such as transistors, conductive structures (e.g., contacts), etch stop layers, or additional layers and structures formed in FEOL/MOL layer 220 are not shown in FIG. 2 for simplicity. These features, structures, elements, and layers are within the spirit and the scope of this disclosure.

In some embodiments, variations of structure 200 are possible. For example, FEOL/MOL layer 220 may include one or more layers. Further, additional interconnect layers may be formed between FEOL/MOL layer 220 and interconnect layer 230. These variations are within the spirit and the scope of this disclosure.

As shown in FIG. 2, interconnect layer 230 includes conductive structures 240 embedded into a dielectric layer 250. By way of example and not limitation, conductive structures 240 can be a via or line formed with a damascene metallization process or any other suitable metallization process. By way of example and not limitation, conductive structures 240 can be filled with a conductive material 260, such as copper or a copper alloy, surrounded by a barrier layer not shown in FIG. 2. Since FIG. 2 is a partial cross-sectional view of structure 200, interconnect layer 230 may include additional conductive structures, like conductive structures 240, not shown in FIG. 2.

By way of example and not limitation, dielectric layer 250 can be an interlayer dielectric (ILD)—e.g., a dielectric layer within interconnect layer 230 that electrically isolates conductive structures 240. In some embodiments, dielectric layer 250 is a material having a dielectric constant value below about 3.9 (e.g., a low-k dielectric). In some embodiments, dielectric layer 250 can include a stack of dielectric layers such as, for example, a low-k dielectric and another dielectric: (i) a low-k dielectric (e.g., carbon doped silicon oxide) and a silicon carbide with nitrogen doping; (ii) a low-k dielectric (e.g., carbon doped silicon oxide) and a silicon carbide with oxygen doping; (iii) a low-k dielectric (e.g., carbon doped silicon oxide) with silicon nitride; or (iv) a low-k dielectric (e.g., carbon doped silicon oxide) with silicon oxide.

By way of example and not limitation, dielectric layer 250 can be deposited with a high-density chemical vapor deposition (HDCVD) process, a plasma-enhanced chemical vapor deposition process (PECVD), a plasma-enhanced atomic layer deposition process (PEALD), or any another suitable deposition process at a thickness between about 100 nm and about 200 nm. The aforementioned deposition thickness ranges, deposition methods, and materials are exemplary and not limiting. Therefore, alternative materials, thickness ranges, or deposition methods can be used and are within the spirit and the scope of this disclosure.

Further, interconnect layer 230 can include one or more etch stop layers, like etch stop layer 270, to facilitate the formation of conductive structures 240. For example, etch stop layer 270 is interposed between dielectric layer 250 and FEOL/MOL layer 220. In some embodiments, interconnect layer 230 is a BEOL metallization layer electrically coupled to conductive structures in FEOL/MOL layer 220. The conductive structures of FEOL/MOL layer 220 are not shown in FIG. 2 for simplicity.

Referring to FIG. 1, method 100 begins with operation 110 and the process of forming a first electrode bilayer on a first interconnect layer (e.g., interconnect layer 230 shown in FIG. 2). In some embodiments, the bilayer deposition includes a sequential deposition of a first metal nitride layer ("MN1") with a first metal-to-nitrogen ratio ("M/N1 ratio") followed by a second metal nitride layer ("MN2") with a second metal-to-nitrogen ratio ("M/N2 ratio") so that M/N1 is greater than M/N2 (e.g., M/N1>M/N2). In some embodiments, MN1 is metal-rich compared to MN2 (e.g., MN1 contains a lower nitrogen concentration than MN2), and MN2 is nitrogen-rich compared to MN1 (e.g., MN2 contains a higher nitrogen concentration than MN1). In some embodiments, the metal M in MN1 and MN2 is common and can be selected from Ti, Ta, W, Co, Ni, Ru, Mo, Au, Ag, or Al. For example, MN1 can be TiN1 and MN2 can be TiN2, or MN1 can be TaN1 and MN2 can be TaN2, etc.

Figure 3:
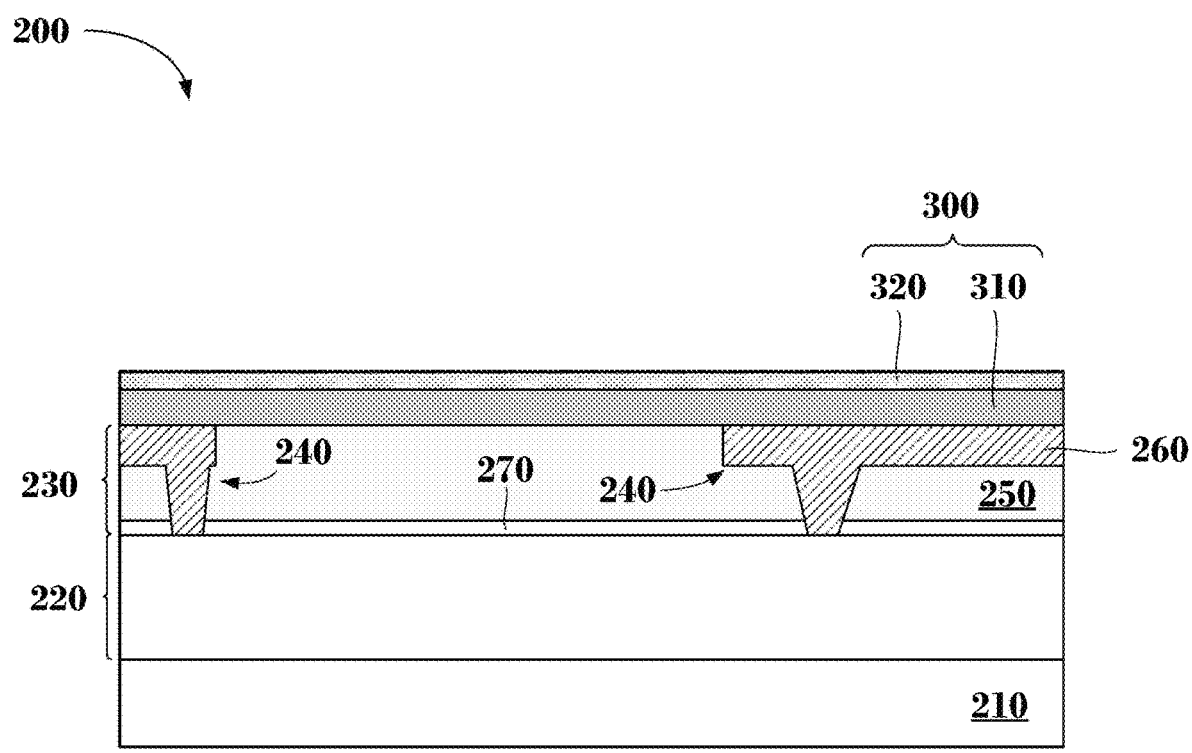

According to some embodiments, MN1 and MN2 can be blanket deposited on interconnect layer 230. By way of example and not limitation, FIG. 3 shows structure 200 after operation 110 of method 100, where a first electrode bilayer 300 is deposited on interconnect layer 230. As discussed above, first electrode bilayer 300 includes MN1 310 and MN2 320 with MN2 320 being nitrogen-rich compared to MN1 310. In some embodiments, MN1 and MN2 are deposited via a PVD-based method, a CVD-based method, an ALD-based method, or another deposition method capable of tuning the nitrogen concentration of MN1 310 and MN2 320 during deposition. By way of example and not limitation, in a PVD-based process, the nitrogen concentration can be tuned by adjusting a nitrogen gas flow during metal sputtering; in a CVD-based process or an ALD-based process, the ammonia gas flow can be adjusted to incorporate the desired amount of nitrogen into the deposited layer. In some embodiments, the metal-to-nitrogen ratio M/N1 can range from about 0.5 to pure metal with no substantial amount of nitrogen (e.g., $0 \leq (M/N1)^{-1} \leq 2$) and the metal-to-nitrogen ratio M/N2 can range from about 0.4 to about 0.9 (e.g., $0.1 \leq (M/N2)^{-1} < 2.5$). In some embodiments, the average nitrogen concentration and nitrogen peak concentration in MN2 is greater than the respective average nitrogen concentration and nitrogen peak concentration in MN1. In some embodiments, the nitrogen peak concentration in MN2 320 is about 40%.

In some embodiments, MN1 310 is deposited with a thickness between about 10 nm and about 100 nm, and MN2 320 is deposited with a thickness between about 1 nm and about 20 nm so that MN1 310 is thicker than MN2 320. For example, if MN1 310 is about 10 nm, MN2 320 is deposited to a thickness less than about 10 nm (e.g., about 5 nm) so that MN2 is thinner than MN1.

Figure 4:
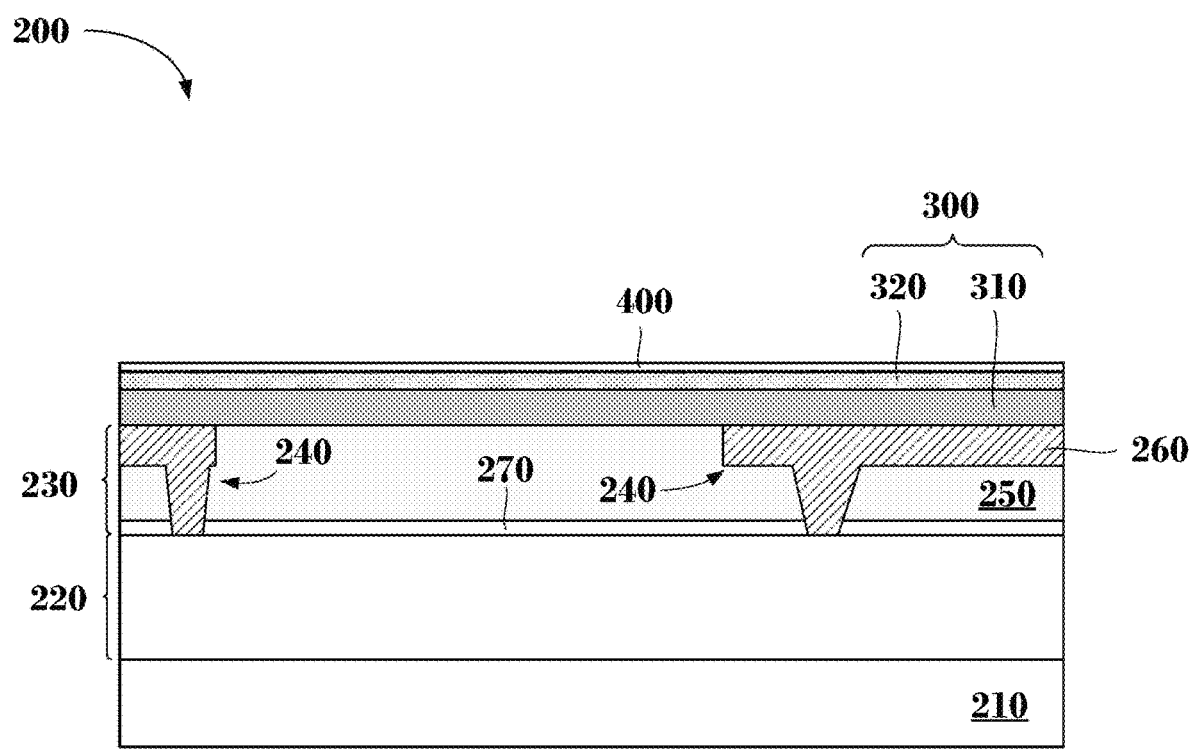

In referring to FIG. 1, method 100 continues with operation 120 and the process of depositing a dielectric layer on first electrode bilayer 300. In some embodiments, the dielectric layer is deposited directly on MN2 320—e.g., without the presence of intervening layers. By way of example and not limitation, FIG. 4 shows structure 200 after the deposition of a dielectric layer 400 according to operation 120. In some embodiments, dielectric layer 400 includes silicon oxide ($SiO_2$), silicon nitride ($Si_3N_4$), aluminum oxide ($Al_2O_3$), yttrium oxide ($Y_2O_3$), titanium oxide ($TiO_2$), hafnium oxide ($HfO_2$), or zirconium oxide ($ZrO_2$); a stack of $ZrO_2/Al_2O_3/ZrO_2$; a stack of $Al_2O_3/ZrO_2/Al_2O_3$; a stack of $ZrO_2/Al_2O_3/ZrO_2/Al_2O_3/ZrO_2$; or a stack including any combination of $SiO_2$, $Si_3N_4$, $Al_2O_3$, $Y_2O_3$, $TiO_2$, $HfO_2$, and $ZrO_2$. In some embodiments, the dielectric layer 400 is conformally deposited on MN2 320 with an ALD-based process, a CVD-based process, or a PVD-based process at a thickness range between about 1 nm and about 20 nm. In some embodiments, dielectric layers thinner than about 1 nm are more susceptible to leakage and should be avoided while thicker dielectric layers (e.g., thicker than 20 nm) decrease the capacitance of the resulting MiM capacitor and are therefore not desirable.

In referring to FIG. 1, operation 100 continues with operation 130 and the process of forming a second electrode bilayer on dielectric layer 400. In some embodiments, the bilayer deposition includes a sequential deposition of a third metal nitride layer ("MN3") with a third metal-to-N ratio ("M/N3") followed by a fourth metal nitride layer ("MN4") with a fourth metal-to-N ratio ("M/N4") so that M/N3 is greater than M/N4. In some embodiments, MN4 is metal-rich compared to MN3, and MN3 is nitrogen-rich compared to MN4. In some embodiments, the metal M in MN3 and MN4 is common and can be selected from Ti, Ta, W, Co, Ni, Ru, Mo, Au, Ag, or Al. By way of example and not limitation, the metal in MN1, MN2, MN3, and MN4 can be the same, or the metal can be the same within each electrode but different between the electrodes. For example, the metal in MN1 and MN2 can be Ti and the metal in MN3 and MN4 can be Ta.

Figure 5:
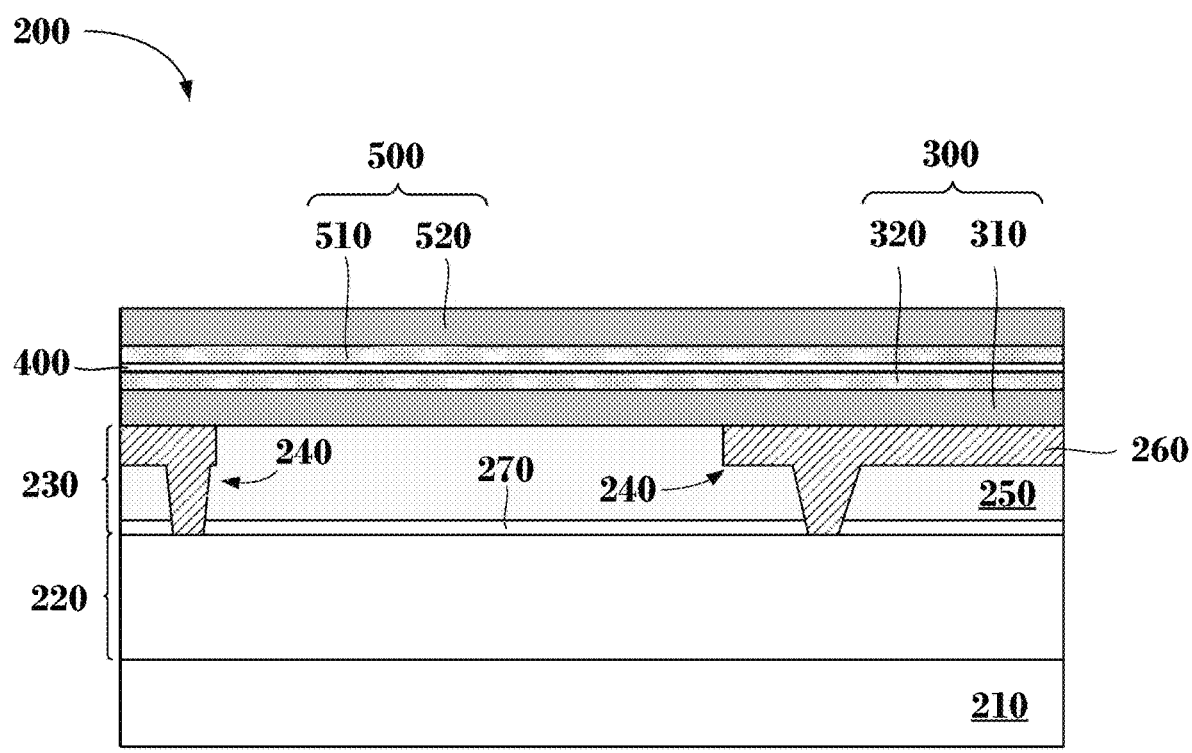

According to some embodiments, MN3 and MN4 (like MN1 and MN2) can be blanket deposited on dielectric layer 400. By way of example and not limitation, FIG. 5 shows structure 200 after operation 130 of method 100, where a second electrode bilayer 500 is deposited on dielectric layer 400. As discussed above, second electrode bilayer 500 includes MN3 510 and MN4 520 with MN3 510 being nitrogen-rich compared to MN4 520. In some embodiments, MN3 and MN4, like MN1 and MN2, are deposited via a PVD-based process, a CVD-based process, an ALD-based process, or another deposition process capable of tuning the nitrogen concentration of MN3 510 and MN4 520 during deposition. By way of example and not limitation, in a PVD-based process, the nitrogen concentration can be tuned by adjusting a nitrogen gas flow during metal sputtering. In a CVD-based process or an ALD-based process, ammonia gas flow can be adjusted to incorporate the desired amount of nitrogen into the deposited layer. In some embodiments, metal-to-nitrogen ratio M/N3 can range from about 0.4 to about 0.9 (e.g., $1.1 \leq (M/N3)^{-1} \leq 2.5$) and metal-to-nitrogen ratio M/N4 can range from about 0.5 to pure metal with no substantial nitrogen concentration (e.g., $0 \leq (M/N4)^{-1} \leq 2$). In some embodiments, the average nitrogen and nitrogen peak concentration in MN3 is larger than the average nitrogen and nitrogen peak concentration in MN4. In some embodiments, the nitrogen peak concentration in MN3 510, like in MN2 320, can be about 40%.

In some embodiments, MN3 510 is deposited with a thickness range between about 1 nm and about 20 nm, and MN4 520 is deposited with a thickness range between about 10 nm and about 100 nm. In some embodiments, MN3 510 is deposited thinner than MN4 520. For example, if MN4 520 is about 10 nm, MN3 510 is deposited to a thickness less than about 10 nm (e.g., about 5 nm).

By way of example and not limitation, MN3 510 and MN2 320 can have a substantially similar metal-to-nitrogen ratio—e.g., M/N3 can be substantially equal to M/N2. Further, MN4 520 and MN1 310 can have a substantially similar metal-to-nitrogen ratio—e.g., M/N4 can be substantially equal to M/N1. In some embodiments, the aforementioned metal-to-nitrogen ratios can be different between MN2 320 and MN3 510 and between MN1 310 and MN4 520. For example, metal-to-nitrogen ratio M/N3 can be greater than metal-to-nitrogen ratio M/N2 (e.g., MN3 can have a lower concentration of nitrogen than MN2) or the other way around depending on the plasma processing MN2 320 and MN3 510 are exposed to. For example, if in a subsequent operation after the formation of the MiM layers, MN2 320 is subjected to additional plasma processing compared to MN3 510, MN2 320 can be deposited with a higher nitrogen concentration than MN3 510. This is possible because the nitrogen concentration in each layer of first electrode bilayer 300 and second electrode bilayer 500 can be tuned independently during deposition.

In some embodiments, the ability of a metal nitride layer to block charges generated by a plasma process substantially improves as the nitrogen concentration in the metal nitride layer increases. At the same time, increasing the nitrogen concentration in a metal nitride layer also increases its resistance, which is not desirable. Therefore, nitrogen-rich metal layers need to be thin to minimize their impact on resistance, but not too thin to provide adequate protection against charges. Consequently, in a metal nitride layer, the nitrogen-rich metal layers' nitrogen concentration and thickness need to be balanced to provide optimum charge protection and electrical performance.

To address the aforementioned resistance issues, MN1 310 and MN4 520 (e.g., the "outer" layers of the MiM capacitor structure) are formed thicker and with a lower nitrogen concentration than MN2 320 and MN3 510 (e.g., the "inner" layers of the MiM capacitor structure) to reduce the overall resistance of the first and second electrode bilayers. Respectively, MN2 320 and MN3 510 are formed thinner and with higher nitrogen concentration than MN1 310 and MN4 520 to minimize their impact on resistance and to provide sufficient charge protection to dielectric layer 400.

In some embodiments, nitrogen-rich nitride layers (e.g., like MN2 320 and MN3 510), which are thinner than about 1 nm, offer inadequate charge protection to dielectric layer 400. Nitrogen rich layers, which are thicker than about 20 nm, unnecessarily increase the resistance of the first and second electrode bilayers. Further, metal-rich metal nitride layers (e.g., like MN1 310 and MN4 520), which are thinner than about 10 nm, offer inadequate resistance reduction. Metal-rich metal nitride layers, which are thicker than about 100 nm, unnecessarily increase the height of the MiM capacitor structure without providing any additional benefit.

Additionally, nitrogen-rich layers (e.g., MN2 320 and MN3 510) with metal-to-nitrogen ratios lower than about 0.4 may offer inadequate charge protection. Nitrogen-rich layers with metal-to-nitrogen ratios greater than about 0.9 may be highly resistive. Similarly, metal-rich layers (e.g., MN1 310 and MN4 520) with metal-to-nitrogen ratios lower than about 0.5 may offer inadequate resistance reduction as discussed above.

Figure 6:
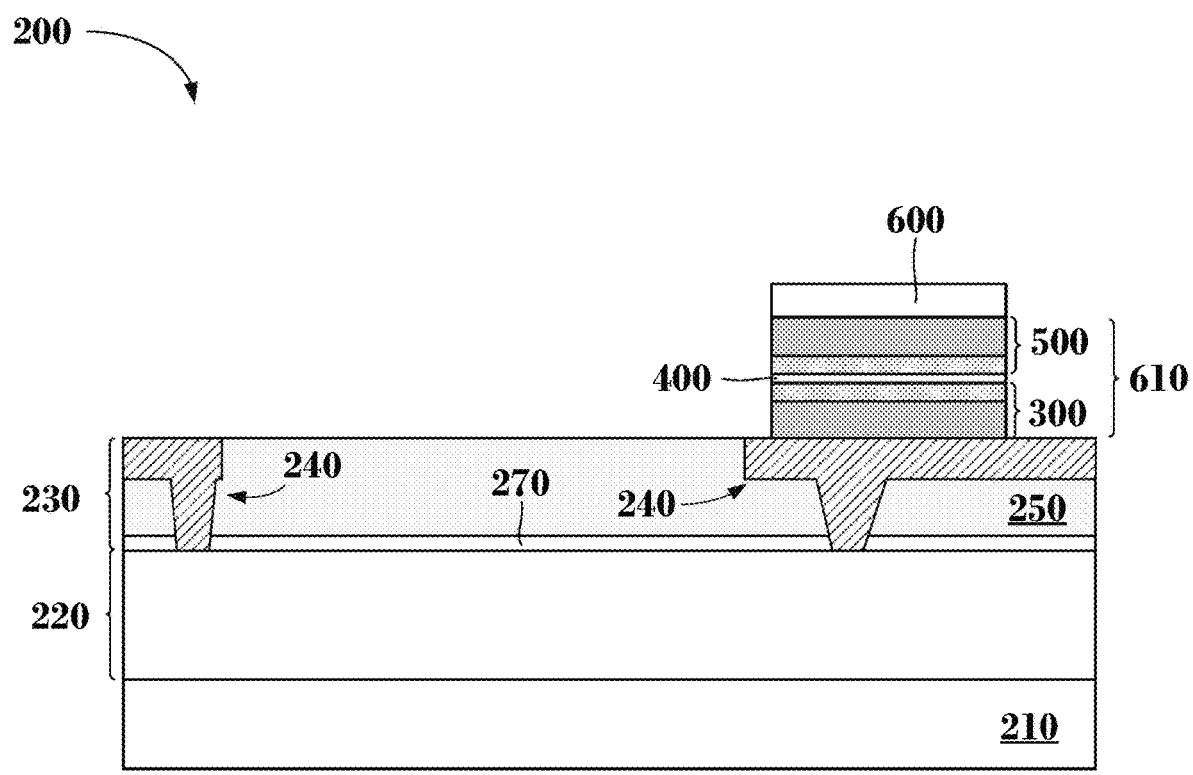

In referring to FIG. 1, operation 100 continues with operation 140 and the process of patterning first electrode bilayer 300, dielectric layer 400, and second electrode bilayer 500 to form a MiM capacitor structure. In some embodiments, patterning first electrode bilayer 300, dielectric layer 400, and second electrode bilayer 500 includes depositing an optional capping layer (e.g., a silicon oxy-nitride (SiON) layer) with a CVD process at a deposition temperature between about 300° C. and about 500° C. and at a thickness between about 200 Å and about 500 Å on second electrode bilayer 500 prior to patterning the stack. Patterning can be accomplished, for example, with a combination of photolithography and etching operations where a photoresist is deposited and patterned on the capping layer. The patterned photoresist is used as an etch mask to protect areas of the stack from etching. Areas of the stack not covered by the patterned photoresist will be removed. Subsequently, an etching process removes the capping layer, first electrode bilayer 300, dielectric layer 400, and second electrode bilayer 500 not covered by the patterned photoresist. The resulting patterned structure is shown in FIG. 6 where the patterned stack with capping layer 600, second electrode bilayer 500, dielectric layer 400, and first electrode bilayer 300 is formed on conductive structure 240. According to some embodiments, second electrode bilayer 500, dielectric layer 400, and first electrode bilayer 300 collectively form a MiM capacitor structure 610.

Figure 7:
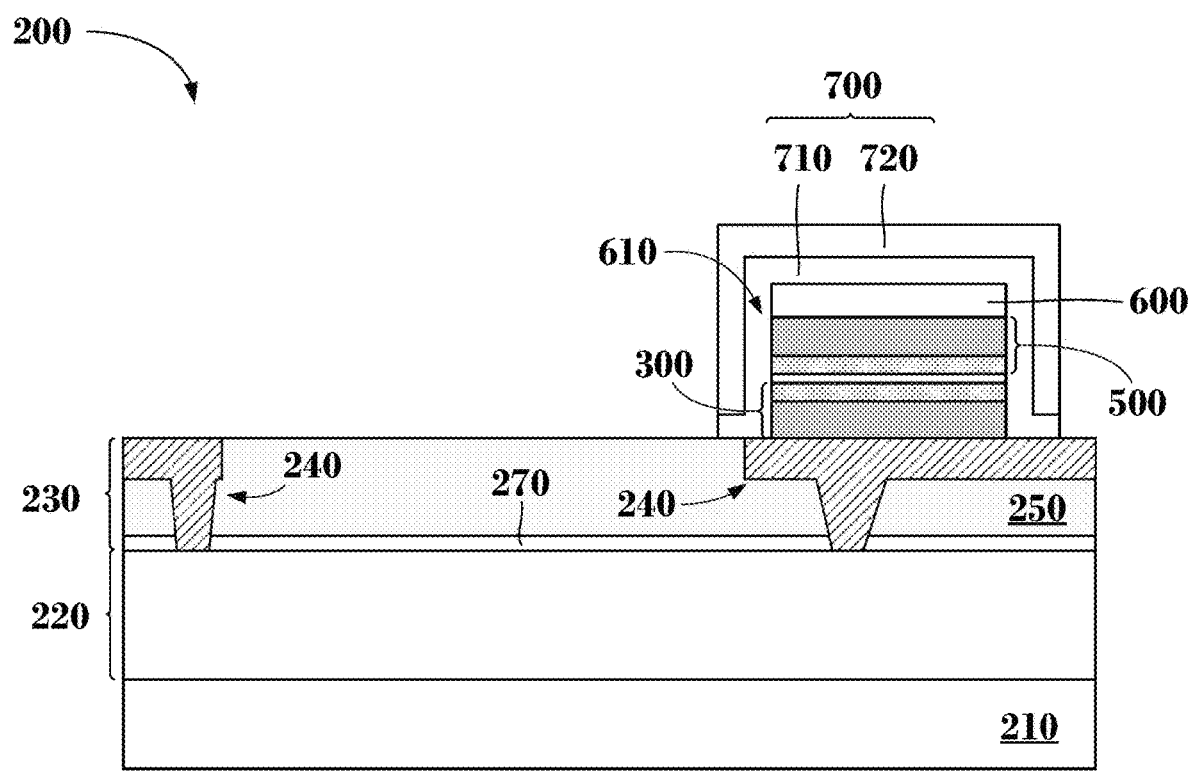

In some embodiments, and in referring to FIG. 7, an optional stack 700 that includes an oxide layer 710 and a silicon nitride layer 720 is formed on MiM capacitor structure 610. In some embodiments, optional stack 700 encapsulates MiM capacitor structure 610. By way of example and not limitation, oxide layer 710 and silicon nitride layer 720 can be blanket deposited at a thickness of about 20 nm and 75 nm respectively and subsequently patterned using photolithography and etching operations. In some embodiments, silicon nitride layer 710 is an etch-stop layer used to facilitate the formation of electrical connections on second electrode bilayer 500.

Figure 8:
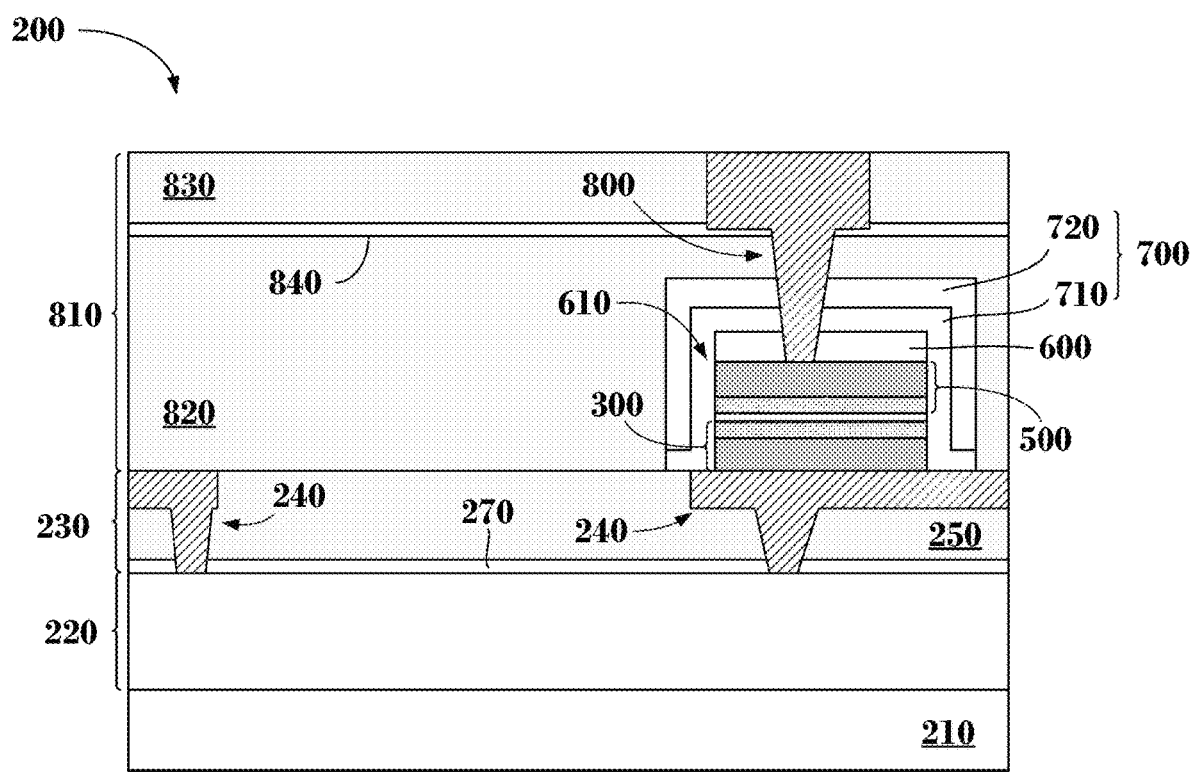

In referring to FIG. 1, operation 100 continues with operation 150 and the process of forming electrical connections to first electrode bilayer 300 and second electrode bilayer 500. In the example of FIG. 7, conductive structure 240 serves as an electrical connection to first electrode bilayer 300. By way of example and not limitation, an electrical connection to second electrode bilayer 500 can be formed by depositing an oxide layer over MiM capacitor structure 610 and forming a conductive structure that traverses through the deposited oxide layer, optional stack 700, and capping layer 600 to contact MN4 520 in second electrode bilayer 500. In some embodiments, FIG. 8 shows the resulting structure where conductive structure 800 is formed in dielectric stack 810 which includes dielectric layers 820 and 830 separated by an etch-stop layer 840. In some embodiments, conductive structure 800 is similar to conductive structure 240 of interconnect layer 230, dielectric layers 820 and 830 are similar to dielectric layer 250, and etch-stop layer 840 is similar to etch-stop layer 270. In some embodiments, dielectric stack 810 and conductive structure 800 are part of another interconnect layer formed on interconnect layer 230.

Figure 9:
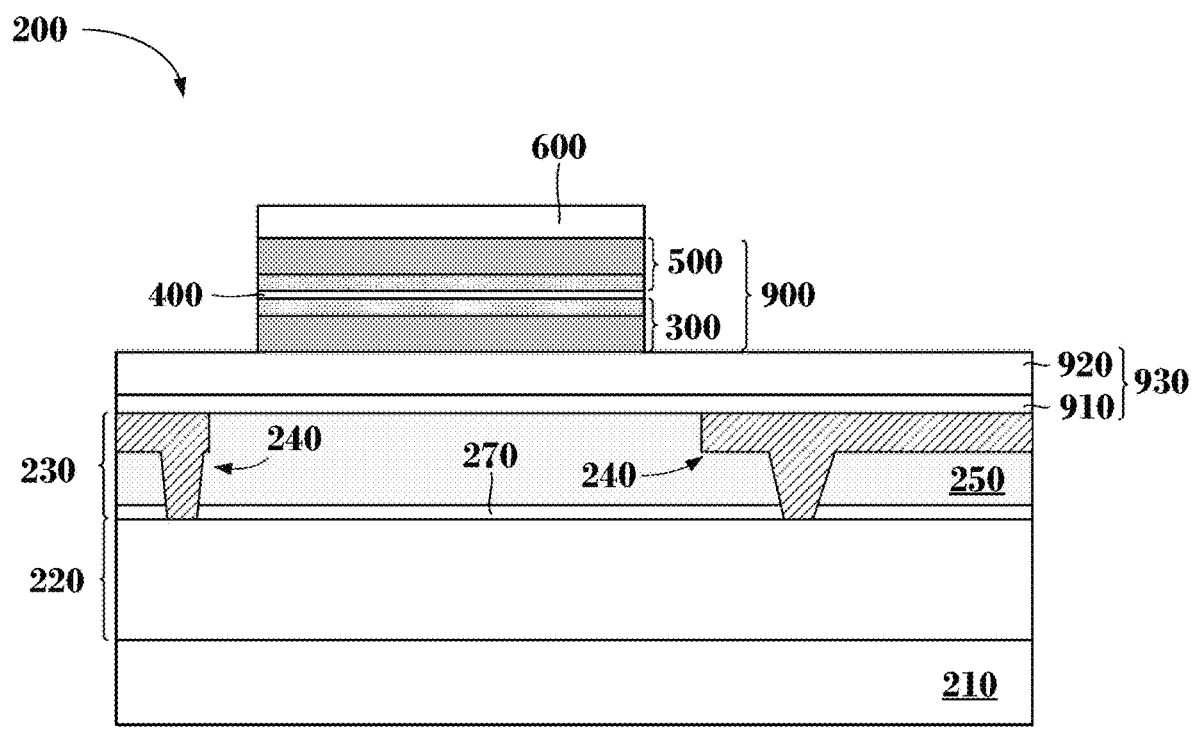
Figure 10:
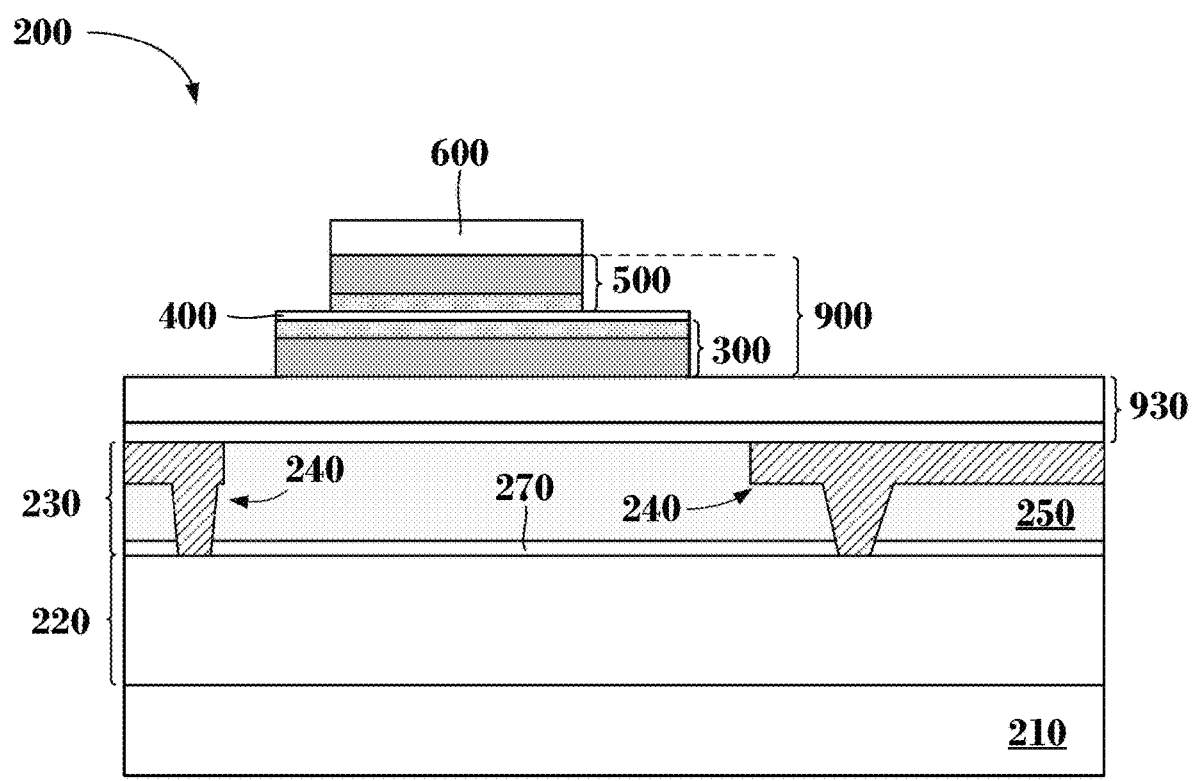
Figure 11:
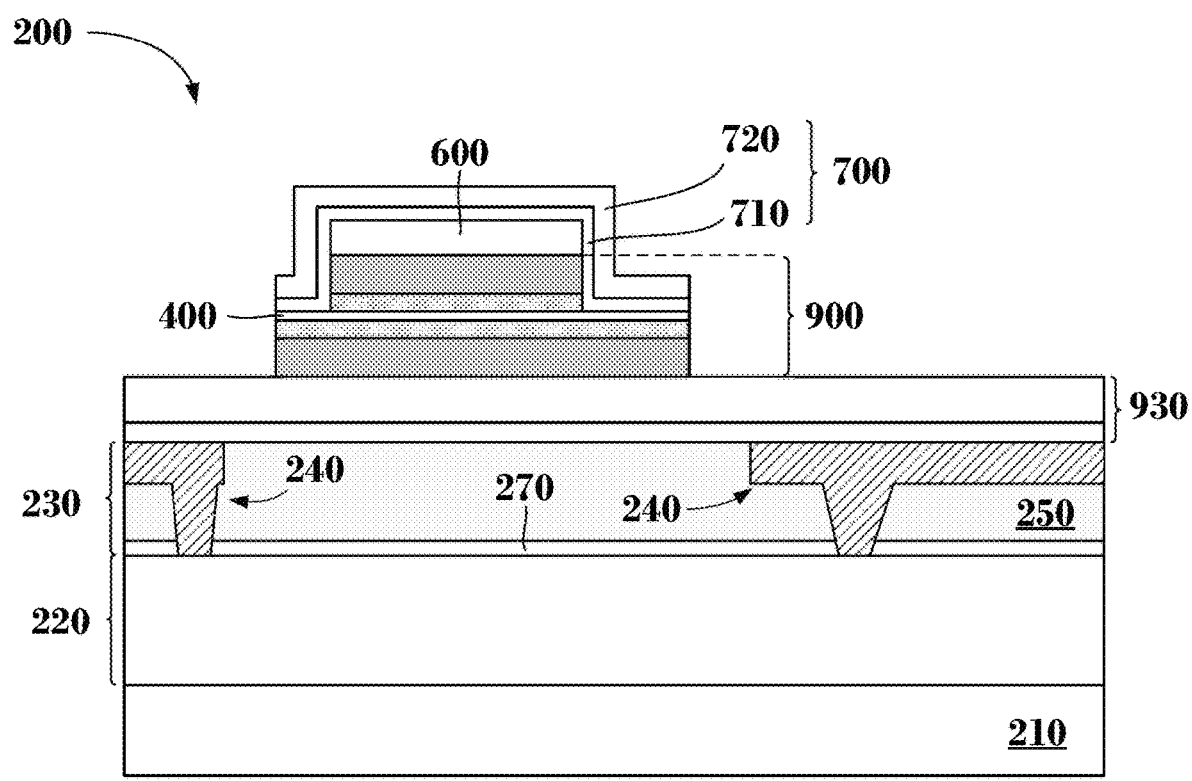
Figure 12:
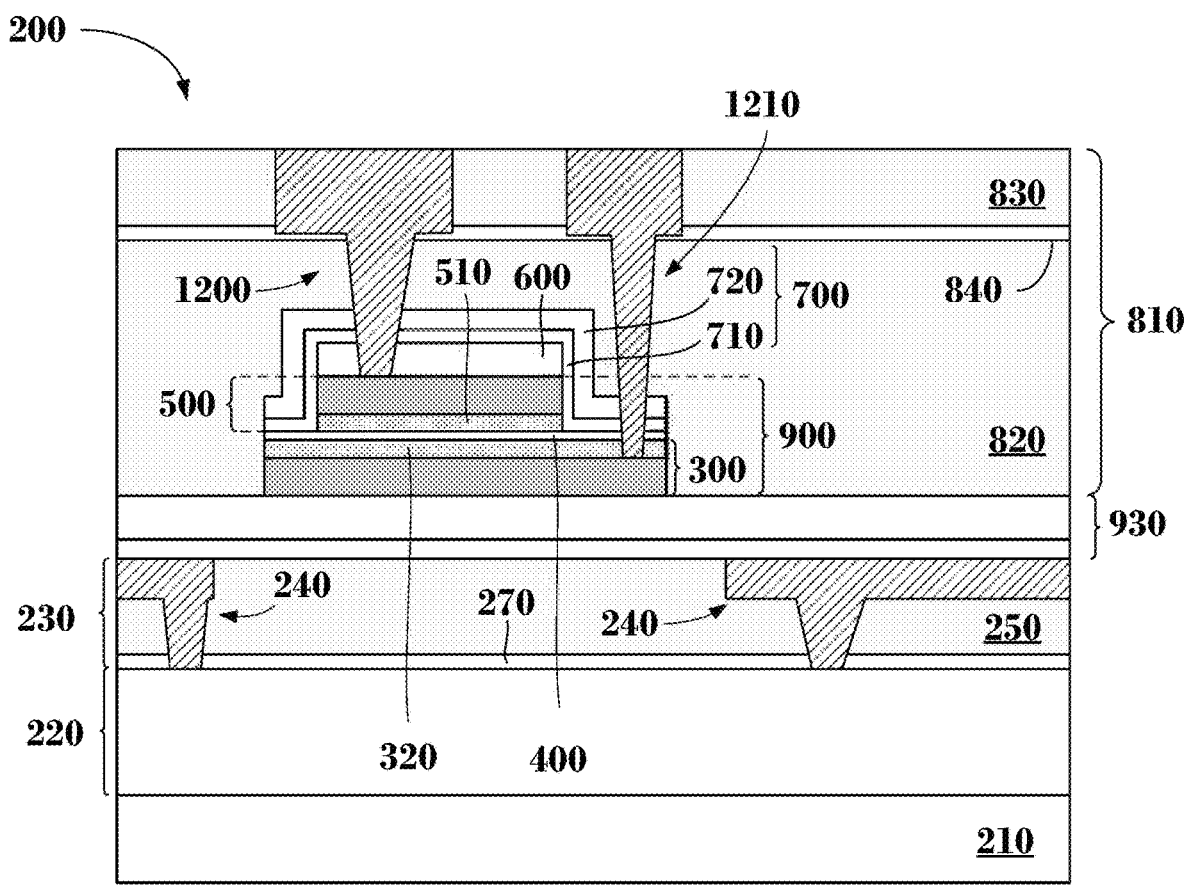

In the example of FIG. 8, first electrode bilayer 300 has a substantially equal surface area with second electrode bilayer 500. Further, in the MiM configuration shown in FIG. 8, a pre-existing conductive structure (e.g., conductive structure 240) is used to form an electrical contact for one of the electrode bilayers in MiM capacitor structure 610. However, this is not limiting and the patterning process described in operation 140 of method 100 can be performed differently to form a MiM capacitor structure with electrodes having a different surface area (e.g., with a surface area difference greater than about 5%). For example, instead of patterning first electrode bilayer 300, dielectric layer 400, and second electrode bilayer 500 to form MiM capacitor structure 610 on conductive structure 240 as shown in FIG. 6, the patterning process could alternatively form an MiM capacitor structure 900 on a dielectric stack 930 over dielectric layer 250 as shown in FIG. 9. Subsequently, a second patterning process can pattern capping layer 600 and second electrode bilayer 500 as shown in FIG. 10 to selectively reduce the size (e.g., the surface area) of second electrode bilayer 500 with respect to first electrode bilayer 300. Optional stack 700 can be subsequently deposited over MiM capacitor structure 900 and patterned as shown in FIG. 11. In a later operation, conductive structures 1200 and 1210 can be formed in dielectric stack 810 to contact second electrode bilayer 500 and first electrode bilayer 300, respectively, as shown in FIG. 12. In some embodiments, dielectric stack 930 shown in FIGS. 9-12 includes a bottom silicon carbide layer and silicon oxide top layer, such as un-doped silicon glass (USG) and a plasma-enhanced oxide (PEOX).

By way of example and not limitation, MiM capacitor structures 610 and 900 shown respectively in FIGS. 8 and 12 can be substantially similar to one another in terms of layer thickness, materials, and metal-to-nitrogen ratios. In some embodiments, both types of MiM capacitor structures 610 and 900 can be formed in the same integrated circuit. Even though MiM capacitor structure 900 may require additional patterning operations as compared to MiM capacitor structure 610 shown in FIG. 8, MiM capacitor structure 900 can be formed on a dielectric layer without the need for an underlying conductive structure. MiM capacitor structures 600 and 900 shown in FIGS. 8 and 12, respectively, are not limiting. Therefore, variations and combination of the layouts shown in FIGS. 8 and 12 are within the spirit and the scope of this disclosure.

The formation of nitrogen-rich layers MN2 320 and MN3 510 at the interface with dielectric layer 400 as described herein offers adequate protection to dielectric layer 400 against charges generated during the formation of conductive structures 800 shown in FIG. 8 or conductive structures 1220 and 1210 shown in FIG. 12, or during the patterning processes described above with respect to operation 140 of method 100. In the absence of nitrogen-rich layers MN2 320 and MN3 510, charges from the aforementioned processes can impact the performance of MiM capacitor structures.

The present disclosure is directed to a method for the fabrication of MiM capacitor structures with metallic electrodes having nitrogen-rich metal nitride layers in contact with the dielectric layer of the MiM capacitor structure. These nitrogen-rich metal nitride layers effectively protect the dielectric layer from charges generated during subsequent operations, including plasma processing. In some embodiments, each metallic electrode includes a stack of metal nitride bilayers, with each bilayer having a metal-rich and a nitrogen-rich layer. In some embodiments, the nitrogen-rich layers are formed in contact with the dielectric layer and have a metal-to-nitrogen ratio between about 0.4 and about 0.9. In some embodiments, the metal-rich layers have a metal-to-nitrogen ratio ranging from about 0.5 to pure metal. In some embodiments, metals used for the metal nitride layers include Ti, Ta, W, Co, Ni, Ru, Mo, Au, Ag, and Al. According to some embodiments, the nitrogen-rich metal nitride layers are formed thinner than their metal-rich counterparts to reduce the resistance of the metallic electrodes.

In some embodiments, a structure includes a first interconnect layer with conductive structures disposed on a substrate. The structure further includes a capacitor structure formed on a conductive structure of the first interconnect layer, where the capacitor structure includes a first electrode bilayer with a first layer and a second layer, where each of the first and second layers includes a different nitrogen concentration. The capacitor structure further includes a dielectric layer disposed on the second layer of the first electrode bilayer and a second electrode bilayer on the dielectric layer. The second electrode bilayer includes a third layer and a fourth layer where each of the third and fourth layers has a different nitrogen concentration. The structure also includes a second interconnect layer on the capacitor structure, where a conductive structure of the second interconnect layer is in contact with the fourth layer of the second electrode bilayer.

In some embodiments, a structure includes a first interconnect layer disposed on a substrate and a capacitor structure formed on the first interconnect layer. The capacitor structure includes a first electrode bilayer having a first layer and a second layer, where each of the first and second layers includes a different nitrogen concentration. The capacitor structure also includes a second electrode bilayer having a third layer and a fourth layer with a different nitrogen concentration. Further, the first electrode bilayer and the second electrode bilayer have a non-overlapping area. The structure also includes a second interconnect layer on the capacitor structure.

In some embodiments, a method includes forming a first interconnect layer on a substrate; depositing a first electrode bilayer on the first interconnect—where the first electrode includes a first layer and a second layer with a different nitrogen concentration. The method also includes depositing a dielectric layer on the first electrode bilayer so that the dielectric layer is in contact with the second layer, and further depositing a second electrode bilayer on the first interconnect where the second electrode bilayer includes a third layer and a fourth layer with a different nitrogen concentration. The method further includes patterning the first electrode bilayer, the dielectric layer, and the second electrode bilayer to form a capacitor structure on the first interconnect layer and forming a second interconnect layer on the capacitor structure—where a conductive structure of the second interconnect layer is in contact with the second electrode bilayer.

The foregoing outlines features of embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a lower etch stop layer on a substrate;
   forming a first interconnect layer on the lower etch stop layer;
   forming a capacitor structure on the first interconnect layer, wherein forming the capacitor structure comprises:
   depositing a first electrode bilayer on the first interconnect layer, wherein the first electrode bilayer comprises a first and second metal nitride layers having different nitrogen concentrations from each other;
   depositing a dielectric layer on the first electrode bilayer so that the dielectric layer is in contact with the second metal nitride layer;
   depositing a second electrode bilayer over the dielectric layer, wherein the second electrode bilayer comprises third and fourth metal nitride layers having different nitrogen concentrations from each other, and wherein a nitrogen-to-metal ratio of the third metal nitride layer is between about 1.1 and about 2.5, wherein depositing the first and second electrode bilayers comprise:
   in response to the second metal nitride layer being subjected to more charge generated in a subsequent plasma process than the third metal nitride layer, depositing the second and third metal nitride layers with the nitrogen concentration of the second metal nitride layer greater than the nitrogen concentration of the third metal nitride layer; and
   in response to the third metal nitride layer being subjected to more charge generated in the subsequent plasma process than the second metal nitride layer, depositing the second and third metal nitride layers with the nitrogen concentration of the third metal nitride layer greater than the nitrogen concentration of the second metal nitride layer; and
   patterning the first electrode bilayer, the dielectric layer, and the second electrode bilayer;
   forming an upper etch stop layer above the capacitor structure; and forming a second interconnect layer on the upper etch stop layer, wherein a conductive structure of the second interconnect layer is electrically coupled to the second electrode bilayer.

2. The method of claim 1, wherein depositing the first electrode bilayer comprises depositing the first metal nitride layer with a lower nitrogen concentration than that of the second metal nitride layer.

3. The method of claim 1, wherein depositing each of the first and second metal nitride layers comprises depositing titanium nitride.

4. The method of claim 1, wherein depositing the first electrode bilayer comprises depositing the first metal nitride layer thicker than the second metal nitride layer.

5. The method of claim 1, wherein depositing the second electrode bilayer comprises depositing the fourth metal nitride layer with a lower nitrogen concentration than that of the third metal nitride layer.

6. The method of claim 1, wherein depositing each of the third and fourth metal nitride layers comprises depositing titanium nitride.

7. The method of claim 1, wherein depositing the second electrode bilayer comprises depositing the third metal nitride layer thinner than the fourth metal nitride layer.

8. A method, comprising:
forming a first interconnect layer on a substrate;
forming a capacitor structure on a conductive structure of the first interconnect layer, wherein forming the capacitor structure comprises:
 forming a first electrode bilayer comprising first and second nitride layers having different nitrogen concentrations from each other;
 forming a dielectric layer disposed on the second layer of the first electrode bilayer; and
 forming a second electrode bilayer on the dielectric layer comprising third and fourth nitride layers having different nitrogen concentrations from each other, wherein the third nitride layer is in contact with the dielectric layer, and wherein the nitrogen concentration of the third nitride layer is different from the nitrogen concentration of the second nitride layer, wherein forming the first and second electrode bilayers comprise:
  in response to the second nitride layer being subjected to more charge generated in a subsequent plasma process than the third nitride layer, depositing the second and third nitride layers with the nitrogen concentration of the second nitride layer greater than the nitrogen concentration of the third nitride layer; and
  in response to the third nitride layer being subjected to more charge generated in the subsequent plasma process than the second nitride layer, depositing the second and third nitride layers with the nitrogen concentration of the third nitride layer greater than the nitrogen concentration of the second nitride layer; and
forming a second interconnect layer on the capacitor structure in contact with the fourth nitride layer.

9. The method of claim 8, wherein forming the capacitor structure further comprises forming the second and third nitride layers to have a higher nitrogen concentration than that of the first and fourth nitride layers.

10. The method of claim 8, further comprising:
depositing a capping layer on a top surface of the second electrode bilayer; and
depositing a stack to cover a top surface of the capping layer and sidewall surfaces of the capacitor structure.

11. The method of claim 10, wherein depositing the stack comprises encapsulating the capacitor structure in a stack of insulating layers.

12. The method of claim 10, wherein depositing the stack comprises:
depositing a silicon oxide layer on the capacitor structure; and
depositing a silicon nitride layer on the silicon oxide layer.

13. The method of claim 8, wherein a width of the capacitor structure is less than a width of the conductive structure.

14. A method, comprising:
forming a first interconnect layer on a substrate;
forming a metal-insulator-metal (MIM) capacitor structure on the first interconnect layer, wherein forming the MIM capacitor structure comprises:
 forming a first electrode bilayer in contact with the first interconnect layer;
 forming a dielectric layer on the first electrode bilayer; and
 forming a second electrode bilayer on the dielectric layer, wherein:
  forming the first electrode bilayer comprises depositing a first charge protection layer to protect the dielectric layer from charge generated by a subsequent plasma process;
  forming the second electrode bilayer comprises depositing a second charge protection layer to protect the dielectric layer from the charge generated by the subsequent plasma process;
  in response to the first charge protection layer being subjected to more charge generated in a subsequent plasma process than the second charge protection layer, depositing the first and second charge protection layers with a nitrogen concentration of the first charge protection layer greater than a nitrogen concentration of the second charge protection layer; and
  in response to the second charge protection layer being subjected to more charge generated in the subsequent plasma process than the first charge protection layer, depositing the first and second charge protection layers with the nitrogen concentration of the second charge protection layer greater than the nitrogen concentration of the first charge protection layer; and
forming a second interconnect layer on the MIM capacitor structure and in contact with the second electrode bilayer.

15. The method of claim 14, wherein forming the first electrode bilayer comprises depositing first and second metal nitride layers and wherein a metal-to-nitrogen ratio of the first metal nitride layer is greater than a metal-to-nitrogen ratio of the second metal nitride layer.

16. The method of claim 14, wherein forming the second electrode bilayer comprises depositing third and fourth metal nitride layers, and wherein a metal-to-nitrogen ratio of the fourth metal nitride layer is greater than a metal-to-nitrogen ratio of the third metal nitride layer.

17. The method of claim 14, wherein forming each of the first and second electrode bilayers comprises depositing layers comprising one or more of titanium (Ti), tantalum (Ta), tungsten (W), cobalt (Co), nickel (Ni), ruthenium (Ru), molybdenum (Mo), gold (Au), silver (Ag), and aluminum (Al).

18. The method of claim 14, wherein forming the dielectric layer comprises depositing one or more of silicon oxide (SiO2), silicon nitride (Si3N4), aluminum oxide (Al2O3), yttrium oxide (Y2O3), titanium oxide (TiO2), hafnium oxide (HfO2), zirconium oxide (ZrO2), or a combination thereof.

19. The method of claim 14, further comprising encapsulating the MIM capacitor with insulating layers.

20. The method of claim 14, wherein:
forming the first electrode bilayer comprises depositing a first metal nitride layer under the first charge protection layer; and
forming the second electrode bilayer comprises depositing a second metal nitride layer above the second charge protection layer.

* * * * *